United States Patent
Mullins et al.

(10) Patent No.: US 8,052,796 B2
(45) Date of Patent: Nov. 8, 2011

(54) CVD REACTOR COMPRISING A PHOTODIODE ARRAY

(75) Inventors: John Tomlinson Mullins, Stockton-on-Tees (GB); Johannes Kaeppeler, Wuerselen (DE); Victor Saywell, GT Barton (GB)

(73) Assignee: Aixtron AG (DE)

( * ) Notice: Subject to any disclaimer, the term of this patent is extended or adjusted under 35 U.S.C. 154(b) by 1212 days.

(21) Appl. No.: 11/505,195

(22) Filed: Aug. 16, 2006

(65) Prior Publication Data

US 2006/0272578 A1 Dec. 7, 2006

Related U.S. Application Data

(63) Continuation of application No. PCT/EP2005/050456, filed on Feb. 2, 2005.

(30) Foreign Application Priority Data

Feb. 18, 2004 (DE) .......................... 10 2004 007 984

(51) Int. Cl.
*C23C 16/00* (2006.01)

(52) U.S. Cl. ........ 118/715; 118/720; 118/728; 118/729; 118/730

(58) Field of Classification Search .............. 118/715, 118/720, 728, 729, 730
See application file for complete search history.

(56) References Cited

U.S. PATENT DOCUMENTS

| 5,885,352 A | 3/1999 | Miyajima |
| 6,221,770 B1 * | 4/2001 | Hillman et al. ............... 438/680 |
| 6,381,021 B1 * | 4/2002 | Somekh et al. ............... 356/445 |
| 6,667,482 B2 * | 12/2003 | Von Der Haar .......... 250/370.11 |
| 2003/0038112 A1 | 2/2003 | Liu et al. |

FOREIGN PATENT DOCUMENTS

| EP | 1 119 024 A2 | 1/2001 |
| JP | 6204143 A | 7/1994 |
| JP | 08170176 A | 7/1996 |
| JP | 2002289601 A | 10/2002 |
| JP | 2003322617 A | 11/2003 |
| WO | WO 02/08487 A1 | 1/2002 |

OTHER PUBLICATIONS

International Search Report, dated May 19, 2005, 3 pages.
Taiwan Search Report; Taiwan Patent Application No. 094100320; Issued: Jul. 19, 2011; 1 page.

* cited by examiner

*Primary Examiner* — Matthew Song
(74) *Attorney, Agent, or Firm* — St. Onge Steward Johnston & Reens LLC

(57) ABSTRACT

The invention relates to a device for depositing especially crystalline layers on especially crystalline substrates, said device comprising a process chamber which is arranged in a reactor housing and comprises a substrate holder for receiving at least one substrate. A gas-admittance body is arranged opposite the substrate holder, said body comprising a gas-leak surface facing the substrate holder and provided with a plurality of essentially evenly distributed outlets for process gases to be introduced into the process chamber. In order to improve the observation of the surface temperature, the inventive device is provided with a plurality of sensors arranged to the rear of the outlets and respectively aligned with an associated outlet.

8 Claims, 2 Drawing Sheets

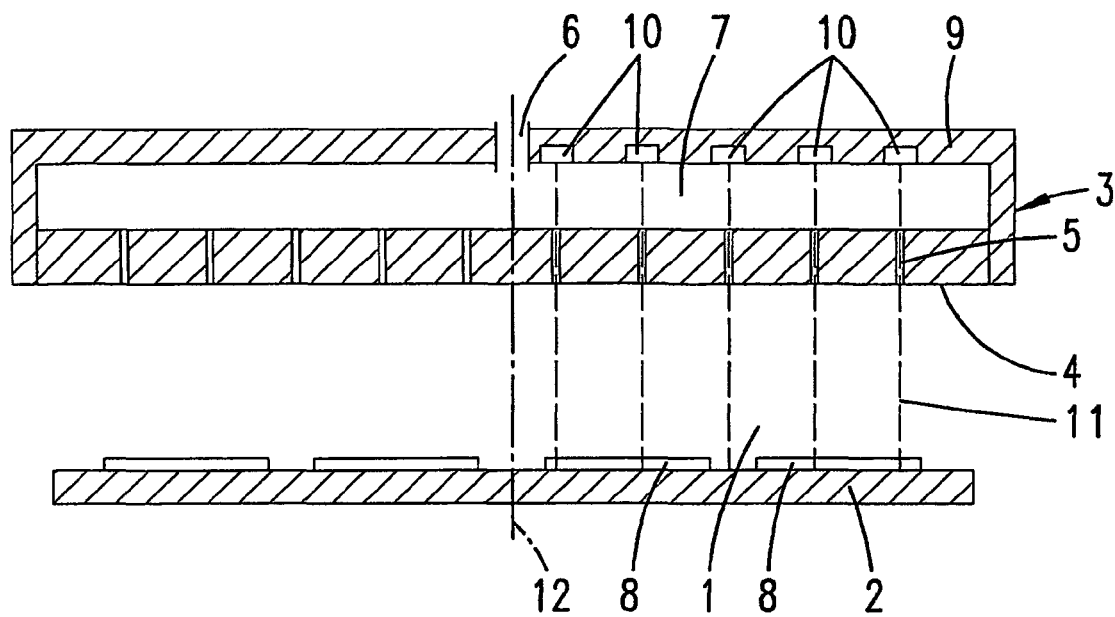
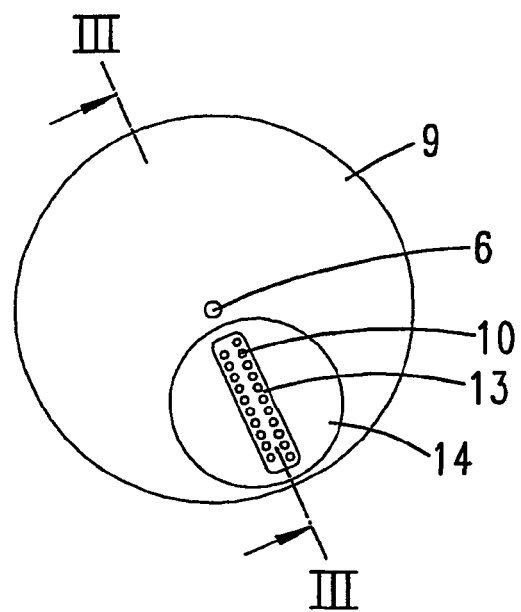

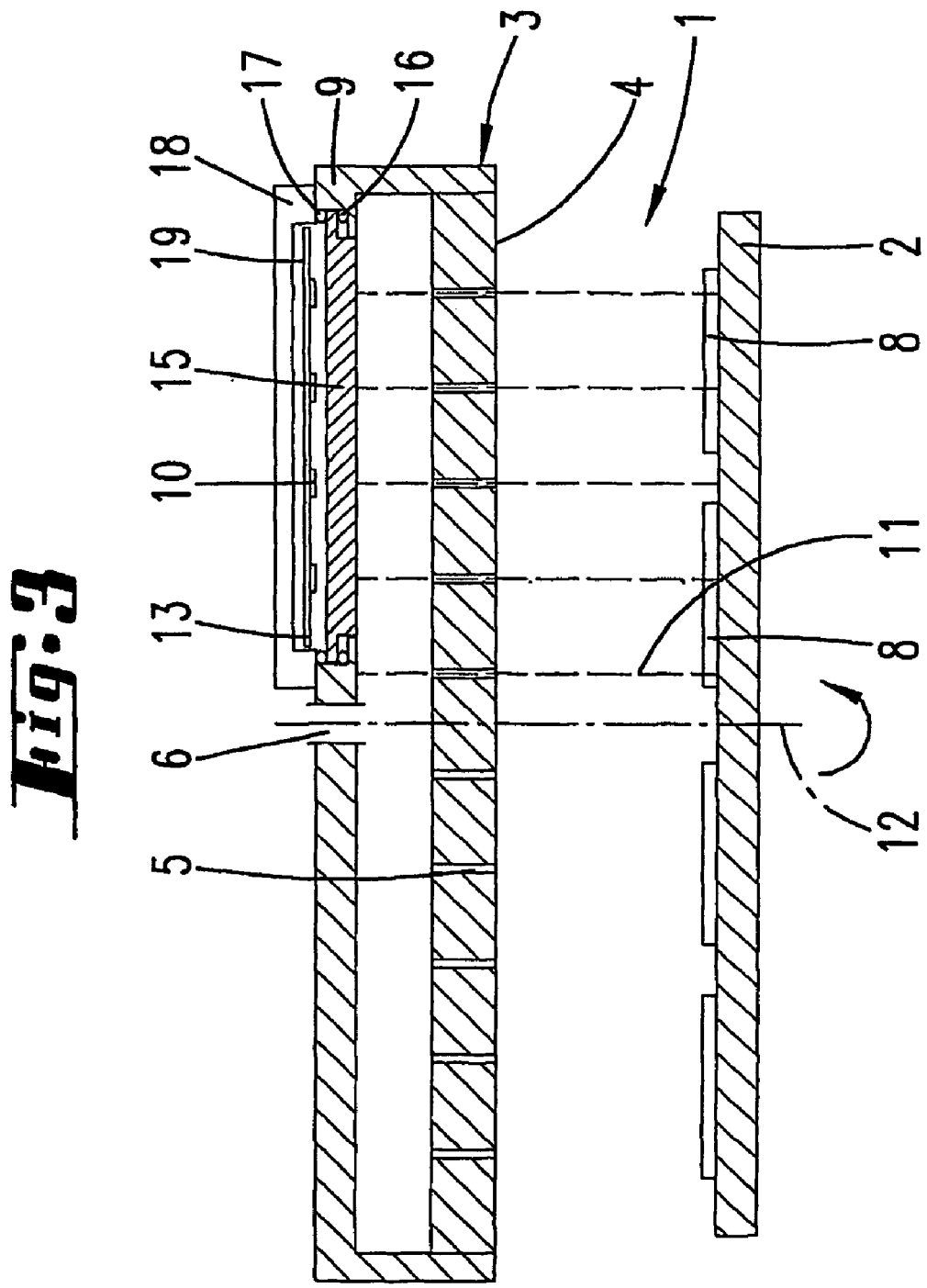

CVD REACTOR COMPRISING A PHOTODIODE ARRAY

CROSS-REFERENCE TO RELATED APPLICATIONS

The present application is a continuation of pending International patent application PCT/EP2005/050456 filed on Feb. 2, 2005 which designates the United States and claims priority from German patent application 10 2004 007 984.6 filed on Feb. 18, 2004, the content of which is incorporated herein by reference.

FIELD OF THE INVENTION

The invention relates to a device for depositing in particular crystalline layers on in particular crystalline substrates, comprising a process chamber which is disposed in a reactor housing and has a substrate holder for receiving one or more substrates, opposite which substrate holder there is a gas inlet member, the gas outlet surface of which, facing the substrate holder, has a multiplicity of substantially uniformly distributed outlet openings for process gases that are to be introduced into the process chamber.

BACKGROUND OF THE INVENTION

A device of this type is already known from EP 0 687 749 B1. This document describes an MOCVD reactor comprising a rotationally symmetrical process chamber, the floor of which forms a substrate holder. The ceiling of the process chamber, opposite the floor, has a multiplicity of narrow, closely adjacent outlet openings, the outlet openings being connected there in an alternating manner to two different rear chambers. Gases that are different from each other are introduced into these chambers and then flow into the process chamber through the outlet openings.

MOCVD reactors comprising a gas inlet member similar to a shower head are additionally also already known from DE 10136858 A1 and DE 10217806 A1.

U.S. Pat. No. 6,500,266 B1 describes a reactor in which a separate cover is provided for the temperature calibration.

With the aforementioned devices, it is possible to deposit crystalline layers, in particular of a III-V material, on substrates disposed on the substrate holder. In order to measure the temperature profile on the substrate holder, which is heated from the rear, it is known to measure its temperature pyrometrically, for example by means of photodiodes. For this purpose, these photodiodes may be disposed vertically above the floor within the gas inlet member. These sensors are then removed again for the operating process, that is the depositing of layers.

It is also known to measure the temperature of the surface of the substrate holder or of the substrates during the growing process.

It is an object of the invention to develop a device of the generic type with a view to better observation of the surface temperature of the substrate holder.

SUMMARY OF THE INVENTION

The object is achieved by the invention specified in the claims.

Claim 1 provides first and foremost that the outlet openings of the gas inlet member are used as optical paths. For this purpose, to the rear of the outlet openings there are sensors, which are disposed in alignment with the axis of the outlet opening in such a way that they can measure the surface temperature of the substrate holder or of a substrate resting on the substrate holder directly underneath the outlet opening. In a development of the invention, it is provided that the sensors are photodiodes. The sensors may be associated with a rear wall of the gas inlet member disposed to the rear of and at a spacing from a front plate having the outlet openings. The gas inlet member may have a number of chambers, as known from EP 0687749 B1.

In the case of such a configuration, the photodiodes preferably lie to the rear of the longest channels adjoining the outlet openings. The sensors may be disposed to the rear of a window opening in the rear wall that is closed by a window pane. This window opening may have a circular shape. The window pane, which may consist of quartz glass, is placed in the window opening. There it is sealed with respect to the gases within the chamber. To the rear of the window pane there may be a printed circuit board, on which the sensors are disposed in rows. The sensors are preferably disposed in two or more rows, which extend in a radial direction from the center of the gas inlet member toward the edge. The sensors of the individual rows may be disposed such that they are offset in relation to one another. The substrate holder advantageously rotates with respect to the gas inlet member during operation. The process chamber and the gas inlet member are then of a circular-symmetrical shape. The sensor array in this case extends over a radius of the gas inlet member. The configuration according to the invention makes it possible to avoid additional, in particular large, bores in the gas inlet head.

BRIEF DESCRIPTION OF THE DRAWINGS

An exemplary embodiment of the invention is explained below with reference to accompanying drawings, in which:

FIG. 1 shows the cross section through a process chamber and the associated gas inlet member of a first exemplary embodiment in schematic representation, FIG. 2 shows the plan view of the gas inlet member of a second exemplary embodiment and FIG. 3 shows a section along the line III-III in FIG. 2.

DETAILED DESCRIPTION OF THE INVENTION

The exemplary embodiment represented in FIG. 1 shows broadly schematically a process chamber 1, the floor 2 of which forms a substrate holder. The floor 2 extends in the horizontal plane and can be rotationally driven about the axis 12.

A gas inlet member 3 forms the ceiling of the process chamber 1. The gas outlet surface 4 formed by the gas inlet member 3 extends parallel to the surface of the substrate holder 2, on which the substrates 8 rest. The gas outlet surface 4 has a multiplicity of outlet openings 5 disposed in the manner of a grid. The outlet openings 5 are formed by a front plate of the gas inlet member. The outlet openings 5 are narrow, closely adjacent bores, which at the rear open into a chamber 7, which is delimited by a rear wall 9. In the drawings, the outlet openings 5 are shown spaced apart by an exaggerated amount.

A process gas flows into the chamber 7 through a central intake 6 and flows through the outlet openings 5 into the process chamber 1 in a substantially uniformly distributed manner.

The outlet openings 5 form parallel optical paths 11 extending in the vertical direction.

In alignment with the axis of the outlet openings 5 there are photodiodes 10, which are associated with the rear wall 9. The photodiodes 10 are disposed in rows, so that the surface temperature of the substrate holder 2 can be measured at many, radially spaced-apart positions. The thermal radiation that is given off by the substrate holder 2 or the substrates 8 resting on the substrate holder 2 and passes along the optical paths 11 through the outlet openings 5 into the chamber 7 to the photodiodes 10 is thereby measured by the photodiodes 10.

In the case of the exemplary embodiment represented in FIGS. 2 and 3, the photodiodes 10 are likewise in a rear wall 9 of a gas inlet member 3. In the case of this exemplary embodiment, the rear wall 9 has a circular opening 14. This opening 14 is closed by a window pane 15 permeable to thermal radiation, for example of quartz glass. Serving to provide a seal are sealing rings 16, 17, on which the edge of the window pane 15 rests. To the rear of the window pane 15 there is a printed circuit board 13. On this printed circuit board 13 there are two rows of photodiodes 10. The rows extend in a radial direction to the center or to the intake 6. The photodiodes 10 of the two rows which are disposed on printed circuit board 13 lie offset in relation to one another. The spacing of the photodiodes 10 on the printed circuit board 3 thereby corresponds to the spacing of the outlet openings 5 from one another. The printed circuit board can be positionally adjusted within a housing 18, which closes the window opening 14 from the rear, in such a way that the individual photodiodes 10 are in alignment with the associated openings 5.

The housing 18 may be screwed to the rear wall 9.

The signals received by the photodiodes 10 may be passed on in a known way by a data acquisition device or a control device for the heating of the substrate holder. This may take place in parallel or sequentially via multiplexers.

A multiplicity of photodiodes disposed in the form of an array allows the temperature of the surface rotating underneath the shower head to be measured over the entire radius. In this case, not only the surface temperature of the substrate holder 2, but also the surface temperature of the substrates 8 can be measured. The sensors 10 may also be active sensors. They may, for example, emit light of a certain wavelength, which is reflected by the surfaces of the substrates. In this way, further properties of the layer deposited at that moment can be determined.

It is regarded as a special advantage of the device according to the invention that the temperatures or other properties can be determined during the growth of a layer. The outlet openings 5 that are present in any case are used as optical channels. Since the outlet openings 5 are permanently purged by the process gases and the gas inlet member 3 can be cooled to temperatures below the decomposition temperature of the process gases, the formation of a coating on the surface of the sensors 10 is effectively prevented. Formation of a coating on the window pane 15 is also prevented by the permanent purging, so that the device requires very little servicing.

The channels that are in the shower head and are associated with the outlet openings 5 have a diameter of approximately 0.7 mm.

All disclosed features are (in themselves) pertinent to the invention. The disclosure content of the associated/accompanying priority documents (copy of the prior application) is also hereby incorporated in full in the disclosure of the application, including for the purpose of incorporating features of these documents in claims of the present application.

What is claimed is:

1. Device for depositing in particular crystalline layers on in particular crystalline substrates, comprising a process chamber which is disposed in a reactor housing and has a substrate holder for receiving one or more substrates, opposite which substrate holder there is a gas inlet member, the front plate of which, facing the substrate holder and forming a gas outlet surface, has a multiplicity of substantially uniformly distributed outlet openings for process gases that are to be introduced into the process chamber, characterized by a multiplicity of sensors, wherein said gas inlet member has a front plate forming said outlet openings and a rear wall having an intake for said process gasses, and wherein said rear wall is spaced apart from said front plate forming a feed gas chamber between said front plate and said rear wall where said process gasses are fed through said intake into said feed gas chamber and then to said outlet openings, wherein said feed gas chamber is common to, and supplies process gases to, all of said outlet openings, and wherein said optical sensors are disposed in said rear wall of said chamber and each of said optical sensors is in alignment with an axis of one of said outlet openings of said front plate.

2. Device according to claim 1, characterized in that the sensors are photodiodes.

3. Device according to claim 1, characterized in that the sensors are disposed to the rear of a window opening in the rear wall that is closed by a window pane.

4. Device according to claim 1, characterized in that the sensors are located in rows on a printed circuit board.

5. Device according to claim 4, characterized in that the sensors are disposed such that they are offset in relation to one another in two or more rows extending in a radial direction.

6. Device according to claim 1, characterized in that the process chamber and the gas inlet member have a circular-symmetrical shape, the substrate holder is rotatable in relation to the gas inlet member and the sensor array extends over a radius of the gas inlet member.

7. Device for depositing in particular crystalline layers on in particular crystalline substrates, comprising a process chamber which is disposed in a reactor housing and has a substrate holder for receiving one or more substrates, opposite which substrate holder there is a gas inlet member, the front plate of which, facing the substrate holder and forming a gas outlet surface, has a multiplicity of substantially uniformly distributed outlet openings for process gases that are to be introduced into the process chamber, characterized by a multiplicity of sensors disposed to the rear of the front plate, each in alignment with and at a spacing from an associated outlet opening, the sensors being associated with a rear wall of the gas inlet member disposed to the rear of and at a spacing from a front plate having the outlet openings, the spacing defining a feed gas chamber that is common to, and supplies process gases to, all of said outlet openings, the sensors being disposed in a row extending in a radial direction, the process chamber and the gas inlet member having a circular-symmetrical shape, the substrate holder being rotatable in relation to the gas inlet member and the row extending over a radius of the gas inlet member.

8. Device according to claim 1, characterized in that all of said outlet openings are uniform in configuration and spacing.

* * * * *